United States Patent [19]

Gardner et al.

[11] 4,367,444

[45] Jan. 4, 1983

[54] FREQUENCY DISCRIMINATOR AND FREQUENCY MODULATOR INCORPORATING SUCH DISCRIMINATOR

[75] Inventors: Brian R. Gardner, Bracknell; Peter J. Munday, Reading, both of England

[73] Assignee: Racal Research Limited, Reading, England

[21] Appl. No.: 199,021

[22] Filed: Oct. 20, 1980

[30] Foreign Application Priority Data

Oct. 20, 1979 [GB] United Kingdom ................ 7936482

[51] Int. Cl.³ ...................... H03D 3/02; H03D 13/00; H03L 7/08
[52] U.S. Cl. ..................................... 332/19; 328/134; 329/50; 331/27
[58] Field of Search ............................... 328/133, 134; 307/525–528; 329/50, 122, 124; 332/19, 14, 30 V; 331/27

[56] References Cited

U.S. PATENT DOCUMENTS 3,393,380 7/1968 Webb et al. ............................ 332/19
3,568,067 3/1971 Williford ........................ 328/134 X
3,748,590 7/1973 Gray ................................ 329/124 X

*Primary Examiner*—Siegfried H. Grimm

*Attorney, Agent, or Firm*—Leydig, Voit, Osann, Mayer & Holt, Ltd.

[57] ABSTRACT

An input signal is mixed with a reference frequency and with a frequency 90° phase-displaced from the reference frequency, so as to produce resultant waveforms whose slopes are dependent on the respective frequency differences detected. Both waveforms are differentiated to produce respective slope signals. Two comparisons are then carried out: one comparison compares the sign of one slope signal with the sign of the waveform producing the other slope signal, and the second comparison compares the sign of the other slope signal with the sign of the waveform producing the first slope signal. The two comparisons produce nominally identical intermediate signals having values dependent on the difference between the input and reference frequencies. Control means operative in dependence on the relative magnitudes of the two waveforms then selects the intermediate signals alternately, each selected intermediate signal constituting the output signal of the circuit. Each intermediate signal is selected as the output signal for a respective period of time for which there are no transitions in the signals from which the respective comparison produced it.

25 Claims, 4 Drawing Figures

FREQUENCY DISCRIMINATOR AND FREQUENCY MODULATOR INCORPORATING SUCH DISCRIMINATOR

BACKGROUND OF THE INVENTION

The invention relates to electrical arrangements and more specifically to frequency discriminators in the form of circuit arrangements which produce an output indicating whether an input signal has a frequency above or below that of a reference frequency.

BRIEF SUMMARY OF THE INVENTION

According to the present invention, there is provided an electrical circuit arrangement for producing an output signal having a value dependent on any frequency difference between an input signal and reference signal, comprising input means producing a plurality of waveforms each of a first or a second type, one type of which has a value dependent on the sign and magnitude of the phase difference between the input signal and the reference signal and the other type of which has a value dependent on the sign and magnitude of the phase difference between the input signal and a signal 90° phase-displaced from the reference signal, first comparing means for comparing a first sign signal dependent on the sign of a said waveform of the first type with a second slope signal dependent on the slope of a said waveform of the second type whereby to produce a first intermediate signal, second comparing means for comparing a second sign signal dependent on the sign of a said waveform of the second type with a first slope signal dependent on the slope of a said waveform of the first type whereby to produce a second intermediate signal nominally the same as the first intermediate signal, selecting means responsive to a control signal for selecting one or other of the intermediate signals as the said output signal, and control means for producing the control signal in dependence on the relative magnitudes of said waveforms of the first and second types respectively (but independent of their respective signs), whereby the intermediate signals are selected by the selecting means for respective periods of time which do not include transitions in the signals from which the respective comparing means produce them.

According to the present invention, there is also provided an electrical circuit arrangement for producing an output signal having a value dependent on any frequency difference between an input signal and a reference signal, comprising input means producing a plurality of waveforms each of a first or a second type, one type of which has a value dependent on the sign and magnitude of the phase difference between the input signal and the reference signal and the other type of which has a value dependent on the sign and magnitude of the phase difference between the input signal and a signal 90° phase-displaced from the reference signal, selecting means responsive to first and second slope signals respectively dependent on the slopes of said waveforms of the first and second type and operative to select one or other of the slope signals in dependence on a control signal, and control means for producing the control signal in dependence on the relative magnitudes of said waveforms of the first and second types respectively (but independent of their respective signs), whereby the slope signals are selected by the selecting means for respective periods of time which do not include transitions in the selected one of them and constitute the said output signal.

According to the present invention, there is further provided an electrical circuit arrangement responsive to a variable-frequency input signal and to a fixed-frequency reference signal and to produce a digital output having one digital value when the frequency of the input signal exceeds the frequency of the reference signal and a second digital value when the frequency of the input signal is less than the frequency of the reference signal, comprising first and second mixing means followed by filtering means for respectively mixing the input signal with the reference signal and a signal phase-displaced by 90° from the reference signal so as to produce first and second waveforms having respective slopes each of which is dependent in magnitude and sign on the magnitude and sign of the phase difference between the signals received by the respective mixer, first and second differentiating means for respectively producing first and second slope-dependent signals having magnitudes and signs dependent on the magnitudes and signs of the slopes of the first and second waveforms, means for limiting each of the slope-dependent signals and for inverting one, only, of them whereby to produce first and second slope sign signals, means for limiting the first waveform whereby to produce a first sign signal dependent on the sign of the first waveform, means for limiting the second waveform whereby to produce a second sign signal dependent on the sign of the second waveform, a first gate connected to receive the first slope sign signal and the second sign signal whereby to produce a first intermediate signal having one digital value when both signals which it receives have the same polarities and a second digital value when they have the opposite polarities, a second gate connected to receive the second slope sign signal and the first sign signal whereby to produce a second intermediate signal having one digital value when both signals which it receives have the same polarities, and a second digital value when they have opposite polarities, selecting means for selecting one or other of the intermediate signals as the digital output signal in dependence on the value of a control signal, and means for producing the control signal in dependence on an instantaneous comparison of the relative magnitudes, but not the relative signs, of the first and second waveforms, whereby the periods of time for which each intermediate signal is selected do not include any transitions in the levels of the signals received by the gate producing that intermediate signal.

According to the present invention, there is still further provided an electrical circuit arrangement responsive to a variable-frequency input signal and to a fixed-frequency reference signal and to produce an output whose magnitude and sign depend respectively on the magnitude and sign of the frequency difference between the input signal and the reference signal, comprising four mixing means respectively connected to mix the input signal with the reference signal, with an inverted version of the reference signal, with the reference signal phase-displaced by 90°, and with an inverted version of the 90° phase-displaced reference signal, each followd by filtering means, whereby to produce first, second, third and fourth waveforms each of which has a magnitude proportional to the phase difference and therefore a slope dependent on the frequency difference between the signals received by the respective mixer, first and second differentiating means for respectively producing two slope signals having magnitudes and signs respectively dependent on the magnitude and signs of the slope of the first and second waveforms, a selecting switch connected to receive the said two slope signals, means responsive to the third waveform to produce a selecting signal having one or other of two values according to whether the third waveform is positive or negative with respect to a datum, means connecting the selecting signal to control the selecting switch so that it selects either one of the said two slope signals according to the value of the selecting signal whereby to produce one intermediate signal, third and fourth differentiating means for respectively producing two further slope signals having magnitudes and signs dependent on the magnitudes and signs of the slopes of the third and fourth waveforms, another selecting switch connected to receive the two further slope signals, means responsive to the first waveform to produce another selecting signal having one or other of two values according to whether the first waveform is positive or negative with respect to a datum, means connecting the other selecting signal to control the other selecting switch to select one or other of the two further slope signals according to the value of the other selecting signal whereby to produce a second intermediate signal of the same form as the first intermediate signal, output selecting means for selecting one or other of the intermediate signals as the said output signal in dependence on the value of a control signal, and means for producing the control signal in dependence on an instantaneous comparison of the relative magnitudes, but not the relative signs, of one of the first and second waveforms with one of the third and fourth waveforms, whereby the period of time for which each intermediate signal is selected does not include any translations in the levels of the signals received by the selecting switch producing that intermediate signal.

DESCRIPTION OF DRAWINGS

Frequency discriminators embodying the invention will now be described, by way of example only, with reference to the accompanying drawings in which.

DESCRIPTION OF PREFERRED EMBODIMENTS

Figure 1:
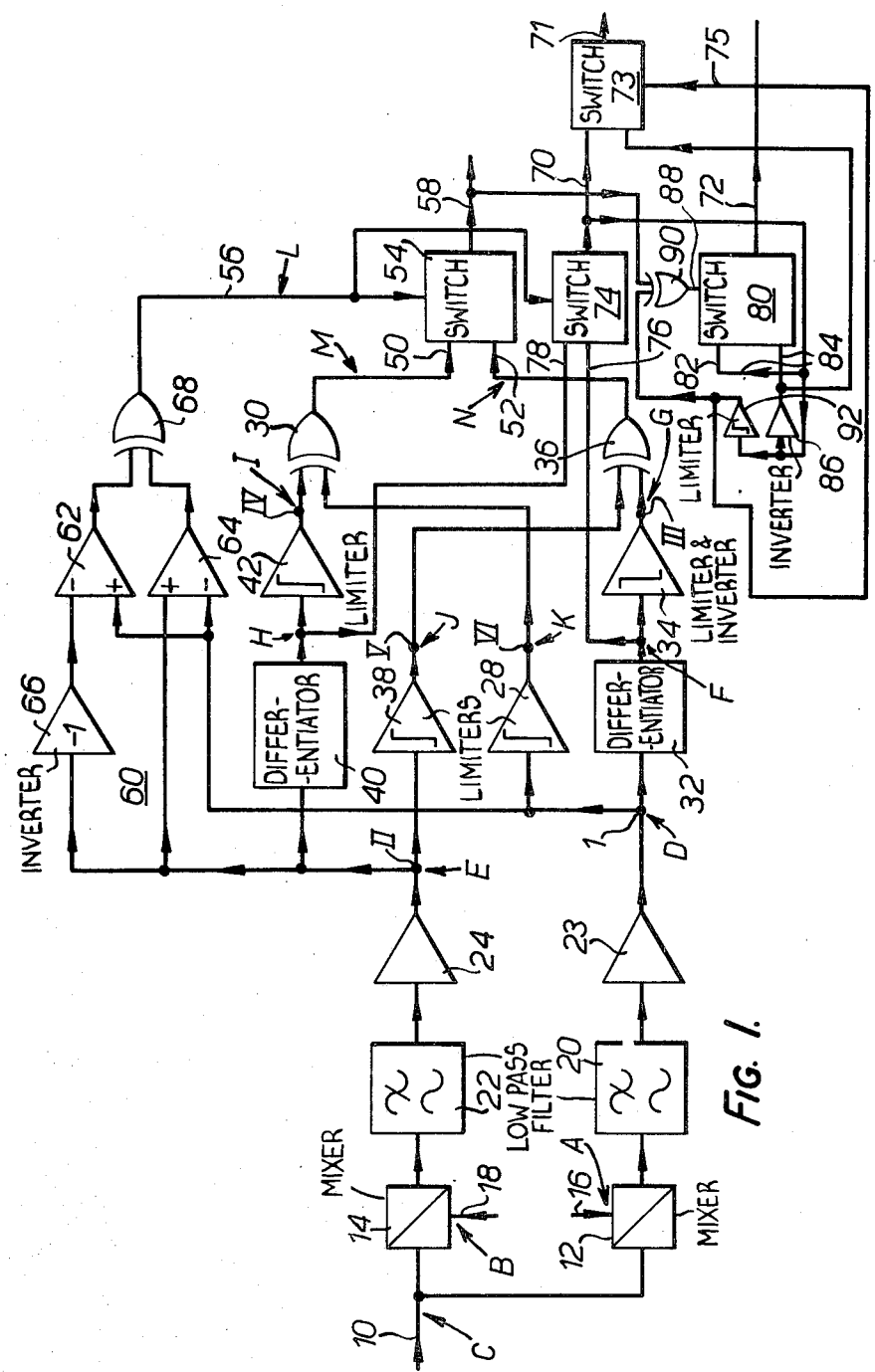
FIG. 1 is a circuit diagram of one of the frequency discriminators.

As shown in FIG. 1, the input signal which may, for example, be a square wave nominally of 1.4 MHz, is applied on an input line 10 and fed to one input of each of two mixers 12 and 14. The second input of mixer 12 is fed on a line 16 with the reference signal (of 1.4 MHz in this example, while the second input of mixer 14 is fed on a line 18 with the reference signal displaced by 90°. The reference signal in this example is a square wave.

Figure 3:
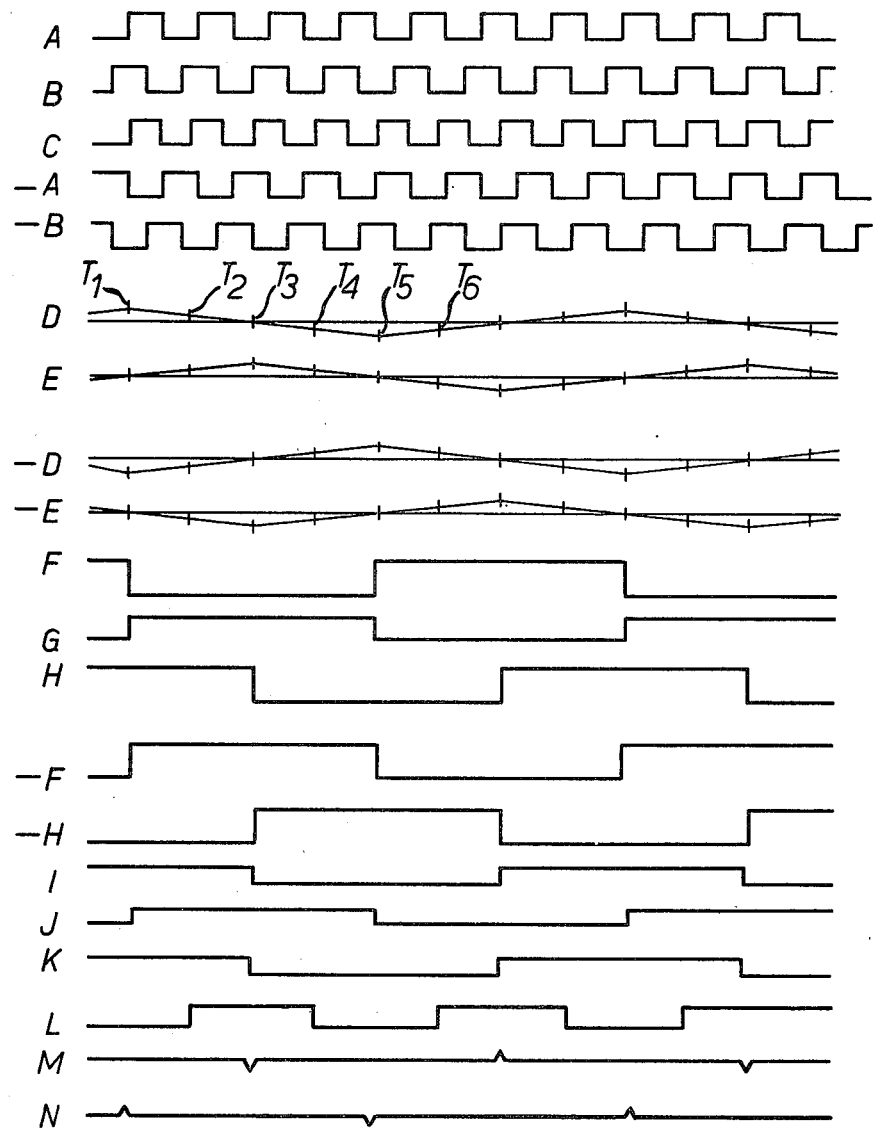
FIG. 3 shows waveforms occurring in the frequency discriminators.

In FIG. 3, waveform A shows the signal on line 16, waveform B shows the signal on line 18, and waveform C shows the input signal on line 10 which, as explained, is assumed in this example to be slightly greater than 1.4 MHz. FIG. 1 is annotated to show where the waveforms of FIG. 3 are produced.

Filters 20 and 22 select the lower sideband outputs of the mixers and these are then amplified by buffer amplifiers 23 and 24. The result is that triangular waveforms are produced at the amplifier outputs depending on the phase difference between the input signal and the signals on lines 16 and 18. Waveform D is the waveform at the output of amplifier 23 (point I, FIG. 1). As shown by waveform D, the output is at a maximum positive level at a point $T_1$, when the waveforms A and C are in phase, falls to point $T_3$ when waveform C leads waveform A by 90°, and reaches a maximum negative level at point $T_5$ when waveform C is at 180° out of phase with waveform A.

Waveform E shows the output of amplifier 24 (point II, FIG. 1). The waveform E is similar to waveform D, but 90° out of phase.

The output of amplifier 23 is then passed to a limiting (but not inverting) amplifier 28 and thence to one input of an EXCLUSIVE OR gate 30. In addition, the output of amplifier 23 is passed to a differentiating circuit 32 and then through a limiting and inverting amplifier 34 to one input of a second EXCLUSIVE OR gate 36.

The output of amplifier 24 is fed through a limiting (but not inverting) amplifier 38 to the second input of gate 36 and is also passed via a differentiating circuit 40 and limiting (but not inverting) amplifier 42 to the second input of gate 30.

The differentiating circuit 32 will produce an output (waveform F) dependent upon the sign and magnitude of the slope of waveform D and the resultant output, after limiting and inversion in the amplifier 34, is the waveform shown at G in FIG. 3 (that is, the waveform at point III in FIG. 1). Waveform H is the output of the differentiating circuit 40 and waveform I shows the corresponding waveform at point IV in FIG. 1.

Waveforms F and H thus each have a magnitude dependent on the frequency divergence between the input signal and the reference signal.

Waveform J shows the waveform at point V in FIG. 1, that is, the output of amplifier 38, while waveform K shows the waveform at point VI, that is, the output of amplifier 28.

Therefore, gate 30 is comparing the waveforms I and K, and gate 36 is comparing the waveforms G and J. The outputs for the two gates are fed to respective inputs 50 and 52 of a switching circuit 54 which is operated, in dependence on a control signal on line 56, to connect one or other of the inputs to an output line 58.

As will be apparent from a comparison of waveforms I and K, gate 30 produces a digital output in the form of a logical "0" (in this example), waveform M, indicating that waveform C has a frequency greater than the reference frequency. Similarly, it is apparent from a comparison of waveforms G and J that gate 36 produces a logical "0" (in this example, waveform N). If the input signal had a lower frequency than the reference frequency, then each of the gates would produce a logical "1". It appears, therefore, that each gate is duplicating the operation of the other. However, the operation of each gate requires that the waveforms I and K (in the case of gate 30), or waveforms G and J (in the case of gate 36) change from one level to the other at the same instant in time. If they do not, or if their transitions are not sharp because of noise or delay, then each gate may not maintain its logical "0" output (in this example) continuously but might switch temporarily to a logical "1" producing momentary pulses P as shown on waveforms M and N. The purpose of the switching circuit 54 is to eliminate this possibility.

The control signal on line 56 for circuit 54 is produced on a comparator circuit 60. Circuit 60 has two comparators 62 and 64. Comparator 62 has its negative input fed with an inverted form of waveform E from amplifier 24 via an inverter 66 and its positive input fed with the output of amplifier 23 (waveform D). Comparator 64 has its positive input fed with waveform E and its negative input fed with waveform D. The comparator outputs are fed to respective inputs of an EXCLUSIVE OR gate 68. The result is that gate 68 produces waveform L (FIG. 3) which changes state each time the magnitude of one of the waveforms D and E exceeds the other. Thus, at point $T_2$ the magnitude of waveform E starts to become greater than that of waveform D and waveform L thus goes HIGH and remains HIGH until time $T_4$ where the magnitude of waveform D now begins to exceed the magnitude of waveform E. At point $T_6$, the magnitude of waveform E once more begins to exceed the magnitude of waveform D, and waveform L therefore goes HIGH again.

Waveform L is the waveform of the control signal applied to the switching circuit 54. The switching circuit is arranged so that it connects its input 52 (the output of gate 36) to the line 58 when waveform L is HIGH, and connects its input 50 (the output of gate 30) to line 58 when waveform L is LOW. In this way, the waveform transitions taking place at time $T_3$ (and at other corresponding times) on the inputs to gate 30 are prevented from affecting the digital output on line 58, and similarly the transitions taking place at times $T_1$ and $T_5$ (and at other corresponding times) on the inputs to gate 36 are prevented from affecting the digital output on line 58.

The circuit arrangement also includes means for producing two other outputs. One such output is produced on a line 71 and is a level having a magnitude dependent on the frequency divergence between the input signal and the reference signal (but independent of the sign of this frequency divergence). The output on line 71 may be passed to a comparator bank (not shown) which can apply various limit bands to it to assess how close the frequency of the input signal is to the reference value.

The second of these two additional outputs is an output on line 72 which is an analogue output having a magnitude and sign dependent on the frequency divergence between the input signal and the reference signal.

Line 71 is fed from a switching unit 73 under control of a further switching unit 74. The latter is controlled by the control signal on line 56 and has an input 76 which is fed from the output of the differentiator circuit 32. This output is shown in waveform F (FIG. 3) and corresponds to waveform G—except, of course, that waveform G has been limited and inverted (as compared with waveform F) by the limiting and inverting amplifier 34.

The second input 78 of the switching circuit 74 is fed from the output of differentiating circuit 40, and this output is shown in waveform H. Waveform H corresponds to waveform I, except, of course, that the latter has been limited by amplifier 42.

When the control signal on line 56 (waveform L) is HIGH, the switching circuit 74 connects its input 76 to line 70 and therefore waveform F is fed to the switching unit 73. When waveform L goes LOW, then the switching circuit 74 connects its input line 78 to line 70 and waveform H is thus fed to the switching unit 73.

The switching circuit 74 ensures that the signal on line 70 is isolated from the transitions of waveforms F and H.

The switching unit 73 also receives an inverted version of the signal on line 70 via an inverter 86. The switching unit 73 is controlled by a control line 75 so as to select either the signal on line 70 or its inverted version from inverter 86 and to pass the selected signal to the output line 71. Line 75 is fed with a limited version of the signal on line 70 which is produced by a limiter 92. Therefore, the polarity of the signal on line 75 changes with the polarity of the signal on line 70 and the switching unit 73 switches in synchronism, thereby producing an output on line 71 which always has the same polarity (and a magnitude dependent on the frequency divergence between the input signal and the reference signal).

The output line 72 is fed from a third switching circuit 80. The switching circuit 80 has one input line 82 which is fed from the ouput (waveform F or H) on line 70, and a second input line 84 which is fed with an inverted version of the output on line 70 via the inverter 86. The switching circuit 80 is controlled by a control signal on a line 88 which is fed from the output of an EXCLUSIVE OR gate 90. Gate 90 has one input fed by the digital output signal on line 58 and a second input fed with the output on line 70 via the limiting amplifier 92.

Therefore, when the input signal has a higher frequency than the reference signal (as in the example being considered) gate 90 will cause switch 80 to connect either line 82 or line 84 to output 72 in such sequence that the signal on output 72 always has one particular polarity and has the magnitude of the signal on line 70 (that is, a magnitude proportional to the frequency divergence between the input and reference signals). If, on the other hand, the input signal has a lower frequency than the reference signal, then the digital output on line 58 will have the opposite logical value, and gate 90 will cause switch 80 to connect lines 82 and 84 to output 72 in such sequence that the signal on output 72 will again have the magnitude of the signal on line 70 but will have the other polarity. As the output on line 72 is derived from line 70 it is (like the output on line 70) unaffected by transitions in the waveform.

Figure 2:
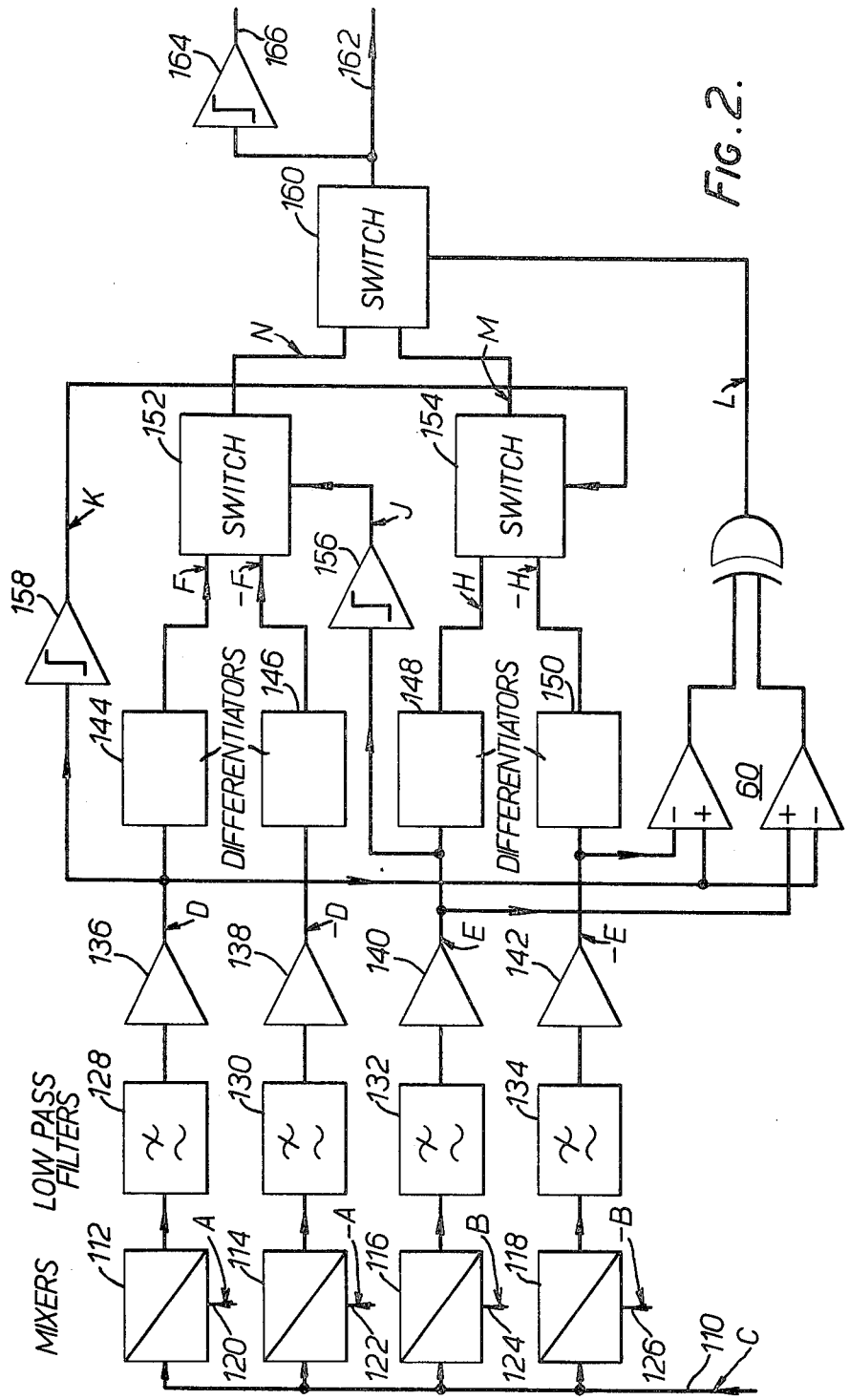
FIG. 2 is a circuit diagram of another of the frequency discriminators.

FIG. 2 shows another form of frequency discriminator which produces an analogue output directly.

As shown, the input signal, which may, for example be a square wave nominally of 1.4 MHz, as in the case of the circuit arrangement of FIG. 1, is applied on an input line 110 to each of four mixers 112, 114, 116 and 118. The second input of mixer 112 is fed on a line 120 with a reference signal (of 1.4 MHz in this example) and the second input of mixer 114 is fed on a line 122 with an inverted version of the reference signal. The second input mixer 116 is fed on a line 124 with the reference signal displaced by 90° and the second input of the mixer 118 is fed on a line 126 with an inverted form of the 90°-displaced reference signal.

Therefore, and referring to FIG. 3, line 120 carries the waveform A, line 122 carries the waveform -A, line 124 carries the waveform B, line 126 carries the waveform -B, and line 110 carries the waveform C.

The outputs of the mixers are fed to respective low pass filters 128, 130, 132 and 134 whose outputs in turn feed respective buffer amplifiers 136, 138, 140 and 142.

The filters select the lower sideband outputs of the mixers, and as in the case of the circuit arrangement of FIG. 1, produce triangular waveforms dependent on the phase difference between the signals mixed in the associated mixer. Therefore, amplifier 136 produces the waveform D, amplifier 138 the waveform -D, amplifier 140 the waveform E and amplifier 142 the waveform -E. Each of the amplifier outputs is fed into a respective differentiating circuit 144, 146, 148 and 150. Therefore, the differentiating circuit 144 produces the waveform F, circuit 146 produces the waveform -F, circuit 148 produces the waveform H and circuit 150 the waveform -H.

The waveforms F and -F are passed to a switch 152 and the waveforms H and -H are passed to a switch 154.

Switch 152 is controlled by the waveform J which is produced by a limiter 156 responsive to the output of amplifier 140. Switch 154 is controlled by waveform K which is produced by a limiter 158 responsive to the output of amplifier 136.

The operation of switch 152, therefore, is to select the waveform F or -F in synchronism with the waveform E. Switch 152 produces waveform N which, in this example, has a positive value indicating that the input signal (waveform C) has a frequency greater than the reference frequency. Similarly, switch 154 is controlled so as to select either the waveform H or the waveform -H, and thus produces the output waveform M. Again, in this example M had a positive value. In each case, the switches will produce a negative value if the input signal had a lower frequency than the reference frequency.

Waveforms M and N are fed into a third switch 160. This is controlled by a comparator circuit 60 which is in the same form as the comparator circuit 60 of FIG. 1 and will not be described again. It therefore produces waveform L on its output line 56.

Therefore, as in the case of the circuit arrangement of FIG. 1, waveform L causes the switch 160 to select either the waveform M or the waveform N, in synchronism with waveform L, so as to produce the selected waveform at its output on line 162. The output on line 162 corresponds to the output on line 72 of the circuit arrangement of FIG. 1 in that it is an analogue output having a magnitude and sign dependent on the frequency divergence between the input signal and the reference signal. This output can be fed through a limiting amplifier 164 to produce a digital output on line 166, indicating the sign of the frequency divergence.

If required, circuitry corresponding to that in the circuit arrangement of FIG. 1 can be provided to produce an output corresponding to that produced on line 71 of FIG. 1, that is, a signal having a magnitude dependent on the frequency or phase divergence between the input signal and the reference signal but independent of the sign of this divergence.

The frequency discriminator of FIG. 2 is advantageous over that described with reference to FIG. 1 in that the signal on line 162 is free from momentary pulses whereas the signals on lines 71 and 72 do suffer from momentary pulses due to the finite delays through inverter 86 and limiter 92.

Although the circuit description has been given on the basis that the input signal and the reference signal are in the form of square waves, they could be sine waves, but in this case only output 58 of FIG. 1 or output 166 of FIG. 2 would be valid.

Figure 4:
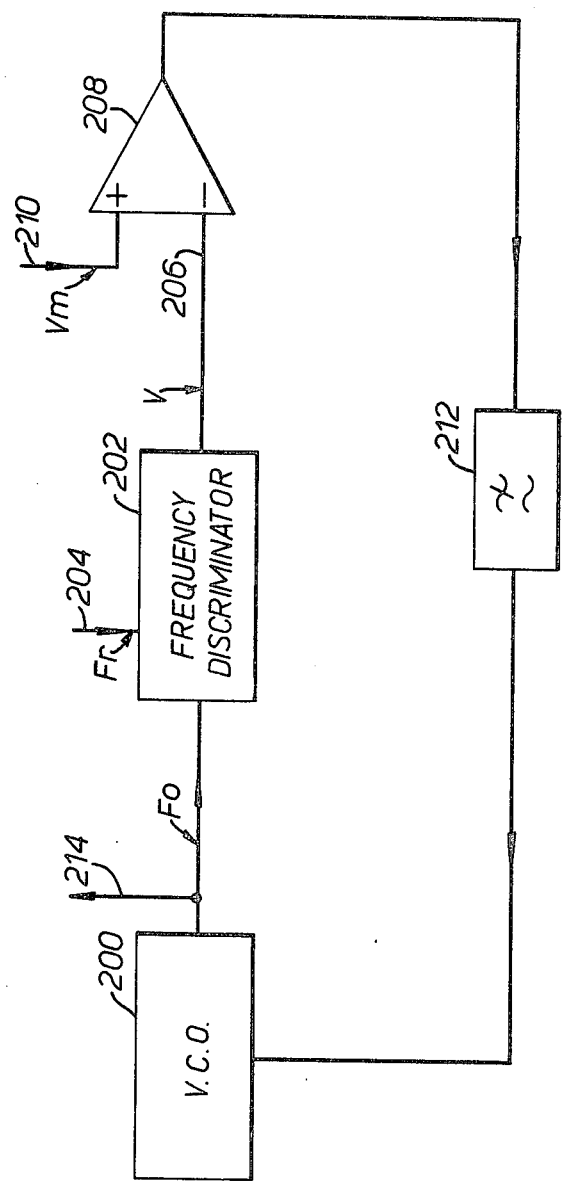
FIG. 4 shows how the frequency discriminator of FIG. 1 or FIG. 2 may be used in a modulating system.

The modulating system of FIG. 4 shows how either the frequency discriminator shown in FIG. 1 or that shown in FIG. 2 can be used to produce frequency modulation.

As shown in FIG. 4, the system includes a voltage-controlled oscillator (VCO) 200 whose output $F_o$ is fed (as the waveform C, FIG. 3) to the frequency discriminator (according to the circuit of FIG. 1 or FIG. 2) which is indicated by the block 202. The reference frequency, $F_r$, (waveform A of FIG. 3) is fed to the discriminator 200 on a line 204, and inverting and phase shifting circuitry is provided within the block 202 to produce the waveforms -A, B and -B.

The frequency discriminator 202 therefore produces an analogue output on a line 206 which is given by $V=K(F_o-F_r)$, and is the signal produced on line 72 of the discriminator of FIG. 1 or on line 162 of the discriminator of FIG. 2; K is a constant. This signal is fed into the inverting input of a differential amplifier 208. The non-inverting input of the amplifier receives a signal $V_m$ on a line 210 which is a waveform representing the data for modulation. The output of amplifier 208 is fed through a loop filter 212 to control the frequency of the VCO 200.

Because the system is connected in a closed loop, it tends to a condition in which:

$$V_m - K(F_o - F_r) = 0,$$

or $$F_o = F_r + (V_m/K)$$

as required. The modulated output is therefore produced on a line 214.

The advantage of the frequency modulating system shown in FIG. 4 is that it has a high stability which is related to the high stability of the reference frequency. Furthermore, an arbitrary modulating voltage $V_m$ can be used. For example, it can have very low frequency components.

What is claimed is:

1. An electrical circuit arrangement for producing an output signal having a value dependent on any frequency difference between an input signal and a reference signal, comprising input means connected to receive the input signal and the reference signal and producing a plurality of waveforms each of a first or a second type, one type of which has a value dependent on the sign and magnitude of the phase difference between the input signal and the reference signal and the other type of which has a value dependent on the sign and magnitude of the phase difference between the input signal and a signal 90° phase-displaced from the reference signal, sign means responsive to waveforms of the first and second types to produce a first sign signal dependent on the sign of a said waveform of the first type and a second sign signal dependent on the sign of a said waveform of the second type, slope means responsive to waveforms of the first and second types to produce a first slope signal dependent on the slope of a said waveform of the first type and a second slope signal dependent on the slope of a said waveform of the second type, first comparing means connected to compare the first sign signal with the second slope signal whereby to produce a first intermediate signal having a value dependent on the said frequency difference, second comparing means connected to compare the second sign signal with the first slope signal whereby to produce a second intermediate signal nominally the same as the first intermediate signal, selecting means responsive to a control signal for selecting one or other of the intermediate signals as the said output signal, and control means for producing the control signal in dependence on the relative magnitudes of said waveforms of the first and second types respectively, whereby the intermediate signals are selected by the selecting means for respective periods of time which do not include transitions in the signals from which the respective comparing means produce them.

2. An electrical circuit arrangement for producing an output signal having a value dependent on any frequency difference between an input signal and a reference signal, comprising input means connected to receive the input signal and the reference signal and producing a plurality of waveforms each of a first or a second type, one type of which has a value dependent on the sign and magnitude of the phase difference between the input signal and the reference signal and the other type of which has a value dependent on the sign and magnitude of the phase difference between the input signal and a signal 90° phase-displaced from the reference signal, slope means responsive to the waveforms of the first and second types to produce first and second slope signals lying on opposite sides of a datum and whose magnitudes relative thereto are respectively dependent on the slopes of the said waveforms of the first and second types, selecting means responsive to the first and second slope signals and operative to select one or other of the slope signals in dependence on a control signal, and control means for producing the control signal in dependence on the relative magnitudes of said waveforms of the first and second types respectively (but independent of their respective signs), whereby the slope signals are selected by the selecting means for respective periods of time which do not include transitions in the selected one of them and each selected one of them constitutes the said output signals.

3. A circuit arrangement according to claim 2, including inverting means for inverting the selected slope signal each time it has a particular polarity whereby to produce the said output signal which always has the other said polarity and a magnitude dependent on the magnitude of the said frequency difference.

4. A circuit arrangement according to claim 1 or 2, in which there are two said waveforms, one of each said type, and in which the said slope means includes first and second differentiating means respectively connected to receive said waveforms and operative to produce the first and second slope signals.

5. A circuit arrangement according to claim 1, in which there are two said waveforms, one of the first type and one of the second type, and in which the said sign means comprises first limiting means connected to receive the waveform of the first type and to produce therefrom the said first sign signal, and second limiting means connected to receive the waveform of the second type and to produce therefrom the said second sign signal, the said slope means comprises differentiating means connected to receive and differentiate the waveform of the second type thereby to produce the said second slope signal and further differentiating means connected to receive, differentiate and invert the waveform of the first type and thereby to produce the said first slope signal, and the said comparing means comprise respective two-input gates each arranged to produce a respective digital signal constituting the respective intermediate signal, each gate producing a digital signal of one binary value when both its signals have the same sign with respect to a datum and a digital signal of the opposite binary value when its two inputs have opposite signs with respect to the said datum.

6. A circuit arrangement according to claim 5, including limiting means for limiting the output of each differentiating means.

7. A circuit arrangement according to claim 5, including second selecting means connected to receive the first and second slope signals, the second selecting means being responsive to the said control signal whereby to select one or other of these two signals, in accordance with the instantaneous value of the control signal, for respective periods of time which do not include transitions in the selected one of the said slope signals, and inverting means operative to invert the said selected one of the said slope signals each time it has a particular polarity whereby to produce an output which always has the other said polarity and a magnitude dependent on the slope of one said waveform and thereby dependent on the magnitude of the said frequency difference.

8. A circuit arrangement according to claim 5, including analogue output means for producing an analogue output having a magnitude and sign dependent on the magnitude and sign of the said frequency difference, the analogue output means comprising switch means connected to receive the first and second slope signals and inverted versions thereof, and means responsive to the said output signal and connected to control the switch means to select, as the said analogue output, a particular one of the said slope signals and its inverted version in succession, the particular one being dependent on the value of the output signal.

9. A circuit arrangement according to claim 7, including inverting means connected to receive the signal selected by the second selector means and to produce an inverted version of that signal, third selecting means connected to receive the signal selected by the second selecting means and the inverted version of that signal and to successively select two signals in accordance with the value of a further control signal, and means connected to be responsive to the value of the said output signal and to the instantaneous sign of the signal selected by the second selecting means and operative to produce the further control signal in dependence thereon so as to change sign in phase with the signal selected by the second selecting means, whereby the signs of the signals successively selected by the third selecting means are the same.

10. A circuit arrangement according to claim 3 or 7, including comparing means for comparing the magnitude of the output of the inverting means with one or more predetermined reference limits whereby to compare the actual frequency difference represented by that magnitude with the values thereof represented by those limits.

11. A circuit arrangement according to claim 1, in which the input means comprises first and second mixing circuits each followed by a respective low pass filter, the first mixing circuit being connected to receive the input signal and the reference signal whereby the output of the respective filter is the waveform of the first type, and the second mixing circuit being connected to receive the input signal and the signal phase-displaced by 90° from the reference signal whereby the output of the respective filter is the waveform of the said second type.

12. A circuit arrangement according to claim 1, in which there are four said waveforms, two of the said first type one of which is an inverted form of the other, and two of the said second type one of which is an inverted form of the other, and in which the first and second comparing means are first and second selecting gates respectively, and including means connecting the first selecting gate to receive two said second slope signals respectively dependent on the slopes of the two waveforms of the second type whereby the selecting means selects one or other of them as the first intermediate signal according to the value of the first sign signal, and means connecting the second selecting gate to receive two said first slope signals respectively dependent on the slopes of the two waveforms of the first type whereby the selecting means selects one or other of them as the second intermediate signal according to the value of the second sign signal.

13. A circuit arrangement according to claim 12, in which
the said slope means includes first and second differentiating means respectively connected to receive and differentiate the two waveforms of the first type whereby to produce the said two first slope signals one of which is the inverse of the other, and third and fourth differentiating means respectively connected to receive and differentiate the waveforms of the said second type so as to produce two said second slope signals one of which is the inverse of the other, and
the said sign means comprises limiting means connected to produce a limited version of one of the waveforms of the said first type and constituting the first sign signal, and limiting means connected to produce a limited version of one of the waveforms of the said second type and constituting the second sign signal.

14. A circuit arrangement according to claim 12, in which the input means comprises a first mixing circuit connected to receive the input signal and the reference signal and followed by a first low pass filter whereby to produce one of the said waveforms of the first type which has a value dependent on the phase difference between the input signal and the reference signal, a second mixing circuit connected to receive the input signal and a signal 180° phase-displaced from the reference signal and followed by a second low-pass filter whereby to produce the other waveform of the first type and which has a value dependent on the phase difference between the input signal and the signal 180° phase-displaced from the reference signal, third mixing means connected to receive the input signal and a signal 90° phase-displaced from the reference signal and followed by a third low pass filter whereby to produce one of the waveforms of the second type and which has a value dependent on the phase difference between the input signal and the signal 90° phase-displaced from the reference signal, and fourth mixing means connected to receive the input signal and a signal 270° phase-displaced from the reference signal and followed by a fourth low pass filter whereby to produce the other waveform of the said second type and which has a value dependent on the phase difference between the input signal and the signal 270° phase-displaced from the reference signal.

15. A circuit arrangement according to claim 12, in which the control means comprises first and second comparators, the first comparator having two inputs respectively connected to receive one of the waveforms of the first type and one of the waveforms of the second type whereby to produce a binary output having one binary value when one of its inputs is positive with respect to the other and having the other binary value when the said one input is negative with respect to the other, the second comparator having two inputs respectively connected to receive the other waveform of the said first type and the said one waveform of the said second type whereby to produce a binary output having one binary value when one of its inputs is positive with respect to the other and having the other binary value when the said one input is negative with respect to the other, and a two-input gate responsive to the two binary outputs to produce the said control signal.

16. A circuit arrangement according to claim 1 or 2, in which the control means comprises first and second comparators, the first comparator being connected to receive two said waveforms of first and second type respectively whereby to produce a binary output having one binary value when one of its inputs is positive with respect to the other and the other binary value when that input is negative with respect to the other, the second comparator being connected to receive one of the said two waveforms and an inverted version of the other whereby to produce a binary output having one binary value when one of its inputs is positive with respect to the other and the other binary value when that input is negative with respect to the other, and a two-input gate connected to receive the two binary outputs whereby to produce the said control signal.

17. A circuit arrangement according to claim 2, in which there are four said waveforms, two of the said first type one of which is an inverted form of the other, and two of the said second type one of which is an inverted form of the other, and in which the said slope means comprises
differentiating means connected to differentiate the four said waveforms whereby to produce first, second, third and fourth differentiated waveforms respectively,
a first selecting switch connected to receive the first and second differentiated waveforms,
a second selecting switch connected to receive the third and fourth differentiated waveforms,
means responsive to the sign of one of the waveforms of the second type to control the first switch to select each of the first and second differentiated waveforms in turn as the said first slope signal in correspondence with the said sign, and
means responsive to the sign of one of the waveforms of the first type to control the second switch to select each of the third and fourth differentiated waveforms in turn as the said second slope signal in correspondence with the said sign.

18. An electrical circuit arrangement responsive to a variable-frequency input signal and to a fixed-frequency reference signal and to produce a digital output having one digital value when the frequency of the input signal exceeds the frequency of the reference signal and a second digital value when the frequency of the input signal is less than the frequency of the reference signal, comprising first and second mixing means followed by filtering means for respectively mixing the input signal with the reference signal and a signal phase-displaced by 90° from the reference signal so as to produce first and second waveforms having respective slopes each of which is dependent in magnitude and sign on the magnitude and sign of the frequency difference between the signals received by the respective mixer, first and second differentiating means for respectively producing first and second slope-dependent signals having magnitudes and signs dependent on the magnitudes and signs of the slopes of the first and second waveforms, means for limiting each of the slope-dependent signals and for inverting one, only, of them whereby to produce first and second slope sign signals, means for limiting the first waveform whereby to produce a first sign signal dependent on the sign of the first waveform, means for limiting the second waveform whereby to produce a second sign signal dependent on the sign of the second waveform, a first gate connected to receive the first slope sign signal and the second sign signal whereby to produce a first intermediate signal having one digital value when both signals which it receives have the same polarities and a second digital value when they have the opposite polarities, a second gate connected to receive the second slope sign signal and the first sign signal whereby to produce a second intermediate signal having one digital value when both signals which it receives have the same polarities, and a second digital value when they have opposite polarities, selecting means for selecting one or other of the intermediate signals as the digital output signal in dependence on the value of a control signal, and means for producing the control signal in dependence on an instantaneous comparison of the relative magnitudes, but not the relative signs, of the first and second waveforms, whereby the periods of time for which each intermediate signal is selected do not include any transitions in the levels of the signals received by the gate producing that intermediate signal.

19. A circuit arrangement according to claim 18, in which the control means comprises first and second comparators, the first comparator being connected to receive the first and second waveforms whereby to produce a binary output having one binary value when one of its inputs is positive with respect to the other and the other binary value when that input is negative with respect to the other, the second comparator being connected to receive one of the first and second waveforms and an interted version of the other whereby to produce a binary output having one binary value when one of its inputs is positive with respect to the other and the other binary value when that input is negative with respect to the other, and a two-input gate connected to receive the two binary outputs whereby to produce the said control signals.

20. An electrical circuit arrangement responsive to a variable-frequency input signal and to a fixed-frequency reference signal and to produce an output whose magnitude and sign depend respectively on the magnitude and sign of the frequency difference between the input signal and the reference signal, comprising four mixing means respectively connected to mix the input signal with the reference signal, with an inverted version of the reference signal, with the reference signal phase-displaced by 90°, and with an inverted version of the 90° phase-displaced reference signal, each followed by filtering means whereby to produce first, second, third and fourth waveforms each of which has a magnitude proportional to the phase difference and therefore a slope dependent on the frequency difference between the signals received by the respective mixer, first and second differentiating means for respectively producing two slope signals having magnitudes and signs respectively dependent on the magnitude and signs of the slopes of the first and second waveforms, a selecting switch connected to receive the said two slope signals, means responsive to the third waveform to produce a selecting signal having one or other of two values according to whether the third waveform is positive or negative with respect to a datum, means connecting the selecting signal to control the selecting switch so that it selects either one of the said two slope signals according to the value of the selecting signal whereby to produce one intermediate signal, third and fourth differentiating means for respectively producing two further slope signals having magnitudes and signs dependent on the magnitudes and signs of the slopes of the third and fourth waveforms, another selecting switch connected to receive the two further slope signals, means responsive to the first waveform to produce another selecting signal having one or other of two values according to whether the first waveform is positive or negative with respect to a datum, means connecting the other selecting signal to control the other selecting switch to select one or other of the two further slope signals according to the value of the other selecting signal whereby to produce a second intermediate signal of the same form as the first intermediate signal, output selecting means for selecting one or other of the intermediate signals as the said output signal in dependence on the value of a control signal, and means for producing the control signal in dependence on an instantaneous comparison of the relative magnitudes, but not the relative signs, of one of the first and second waveforms with one of the third and fourth waveforms, whereby the periods of time for which each intermediate signal is selected do not include any transitions in the levels of the signals received by the selecting switch producing that intermediate signal.

21. A circuit arrangement according to claim 20, in which the control means comprises first and second comparators, the first comparator having two inputs respectively connected to receive the first and fourth waveforms whereby to produce a binary output having one binary value when one of its inputs is positive with respect to the other and having the other binary value when the said one input is negative with respect to the other, the second comparator having two inputs respectively connected to receive the first and third waveforms whereby to produce a binary output having one binary value when one of its inputs is positive with respect to the other and having the other binary value when the said one input is negative with respect to the other, and a two-input gate responsive to the two binary outputs to produce the said control signal.

22. A frequency modulating arrangement, comprising an adjustable oscillator producing a variable frequency signal, means producing a reference signal,
input means connected to receive the variable frequency signal and the reference signal and producing a plurality of waveforms each of a first or a second type, one type of which has a value dependent on the sign and magnitude of the phase difference between the variable frequency signal and the reference signal and the other type of which has a value dependent on the sign and magnitude of the phase difference between the variable frequency signal and a signal 90° phase-displaced from the reference signal,
sign means responsive to waveforms of the first and second types to produce a first sign signal dependent on the sign of a said waveform of the first type and a second sign signal dependent on the sign of a said waveform of the second type,
slope means responsive to waveforms of the first and second types to produce a first slope signal dependent on the slope of a said waveform of the first type and a second slope signal dependent on the slope of a said waveform of the second type,
first comparing means connected to compare the first sign signal with the second slope signal whereby to produce a first intermediate signal having a value dependent on the said frequency difference,
second comparing means connected to compare the second sign signal with the first slope signal whereby to produce a second intermediate signal nominally the same as the first intermediate signal,
selecting means responsive to a control signal for selecting one or other of the intermediate signals,
control means for producing the control signal in dependence on the relative magnitudes of said waveforms of the first and second types respectively (but independent of their respective signs), whereby the intermediate signals are selected by the selecting means for respective periods of time which do not include transitions in the signals from which the respective comparing means produce them,
a differential amplifier connected to receive each selected intermediate signal and a modulating signal and to produce a difference output dependent on their difference, and
means connecting the said difference output to the oscillator to control the frequency of the variable frequency signal in a sense such as to reduce the said difference output towards zero, whereby the variable frequency signal of the oscillator constitutes a modulated output frequency.

23. A frequency modulating arrangement, comprising
an adjustable oscillator producing a variable frequency signal,
means producing a reference signal,
first and second mixing means followed by filtering means for respectively mixing the variable frequency signal with the reference signal and a signal phase-displaced by 90° from the reference signal so as to produce first and second waveforms having respective slopes each of which is dependent in magnitude and sign on the magnitude and sign of the frequency difference between the signals received by the respective mixer,
first and second differentiating means for respectively producing first and second slope-dependent signals having magnitudes and signs dependent on the magnitudes and signs of the slopes of the first and second waveforms,
means for limiting each of the slope-dependent signals and for inverting one, only, of them whereby to produce first and second slope sign signals,
means for limiting the first waveform whereby to produce a first sign signal dependent on the sign of the first waveform,
means for limiting the second waveform whereby to produce a second sign signal dependent on the sign of the second waveform,
a first gate connected to receive the first slope sign signal and the second sign signal whereby to produce a first intermediate signal having one digital value when both signals which it receives have the same polarities and a second digital value when they have the opposite polarities,
a second gate connected to receive the second slope sign signal and the first sign signal whereby to produce a second intermediate signal having one digital value when both signals which it receives have the same polarities, and a second digital value when they have opposite polarities,
selecting means for selecting one or other of the intermediate signals in dependence on the value of a control signal,
means for producing the control signal in dependence on an instantaneous comparison of the relative magnitudes, but not the relative signs, of the first and second waveforms, whereby the periods of time for which each intermediate signal is selected do not include any transitions in the levels of the signals received by the gate producing that intermediate signal,
a differential amplifier connected to receive each selected intermediate signal and a modulating signal and to produce a difference output dependent on their difference, and
means connecting the said difference output to the oscillator to control the frequency of the variable frequency signal in a sense such as to reduce the said difference output towards zero, whereby the variable frequency signal of the oscillator constitutes a modulated output frequency.

24. A frequency modulating arrangement, comprising
an adjustable oscillator producing a variable frequency signal,
means producing a reference signal,
four mixing means respectively connected to mix the variable frequency signal with the reference signal, with an inverted version of the reference signal, with the reference signal phase-displaced by 90°, and with an inverted version of the 90° phase-displaced reference signal, each followed by filtering means whereby to produce first, second, third and fourth waveforms each of which has a magnitude proportional to the phase difference and therefore a slope dependent on the frequency difference between the signals received by the respective mixer,
first and second differentiating means for respectively producing two slope signals having magnitudes and signs respectively dependent on the magnitude and signs of the slopes of the first and second waveforms,
a selecting switch connected to receive the said two slope signals,
means responsive to the third waveform to produce a selecting signal having one or other of two values according to whether the third waveform is positive or negative with respect to a datum, means connecting the selecting signal to control the selecting switch so that it selects either one of the said two slope signals according to the value of the selecting signal whereby to produce an intermediate signal, third and fourth differentiating means for respectively producing two further slope signals having magnitudes and signs dependent on the magnitudes and signs of the slopes of the third and fourth waveforms, another selecting switch connected to receive the two further slope signals, means responsive to the first waveform to produce another selecting signal having one or other of two values according to whether the first waveform is positive or negative with respect to a datum, means connecting the other selecting signal to control the other selecting switch to select one or other of the two further slope signals according to the value of the other selecting signal whereby to produce a second intermediate signal of the same form as the first intermediate signal, output selecting means for selecting one or other of the intermediate signals in dependence on the value of a control signal, means for producing the control signal in dependence on an instantaneous comparison of the relative magnitudes, but not the relative signs, of one of the first and second waveforms with one of the third and fourth waveforms, whereby the periods of time for which each intermediate signal is selected do not include any transitions in the levels of the signals received by the selecting switch producing that intermediate signal, a differential amplifier connected to receive each selected intermediate signal and a modulating signal and to produce a difference output dependent on their difference, and means connecting the said difference output to the oscillator to control the frequency of the variable frequency signal in a sense such as to reduce the said difference output towards zero, whereby the variable frequency signal of the oscillator constitutes a modulated output frequency.

25. A system according to claim 22, 23 or 24, in which the modulating signal is a digital modulating signal.

* * * * *

UNITED STATES PATENT AND TRADEMARK OFFICE
CERTIFICATE OF CORRECTION

PATENT NO. : 4,367,444
DATED : January 4, 1983
INVENTOR(S) : Gardner et al.

It is certified that error appears in the above—identified patent and that said Letters Patent is hereby corrected as shown below:

Column 2, line 62, correct "followd" to -- followed --.

Column 9, line 7, after "tively" insert --(but independent of their respective signs)--.

Signed and Sealed this

Fifth Day of July 1983

[SEAL]

Attest:

GERALD J. MOSSINGHOFF

Attesting Officer

Commissioner of Patents and Trademarks